United States Patent [19]

Sugio et al.

[11] 4,389,516
[45] Jun. 21, 1983

[54] CURABLE POLYPHENYLENE ETHER RESIN COMPOSITION

[75] Inventors: Akitoshi Sugio, Ohmiya; Masanobu Masu, Tokyo; Masatugu Matunaga, Ibaraki, all of Japan

[73] Assignee: Mitsubishi Gas Chemical Company, Inc., Japan

[21] Appl. No.: 246,314

[22] Filed: Mar. 23, 1981

[30] Foreign Application Priority Data

Mar. 24, 1980 [JP] Japan ................................ 55-37130
Apr. 3, 1980 [JP] Japan ................................ 55-44428
Apr. 15, 1980 [JP] Japan ................................ 55-49391

[51] Int. Cl.$^3$ ............................................. C08L 71/04
[52] U.S. Cl. .................................... 525/534; 428/411
[58] Field of Search ........................................ 525/534

[56] References Cited

U.S. PATENT DOCUMENTS 3,595,900  7/1971  Loudas et al. .................... 525/534
3,652,710  3/1972  Holub et al. ....................... 525/534
3,773,718  11/1973  Klebe et al. ....................... 525/534

Primary Examiner—Harold D. Anderson
Attorney, Agent, or Firm—Wenderoth, Lind & Ponack

[57] ABSTRACT

A curable polyphenylene ether resin composition comprising
(a) a polyphenylene ether resin, and
(b) at least one polyfunctional compound selected from the group consisting of polyfunctional maleimides having at least two maleimide groups or the prepolymer thereof, polyfunctional cyanate esters having at least two cyanate ester groups or the prepolymer thereof, and pre-copolymers of the polyfunctional maleimides and the polyfunctional cyanate esters.

The cured resin composition has utility in rustproofing paints, electrical insulating varnishes, adhesives and molding material.

21 Claims, No Drawings

CURABLE POLYPHENYLENE ETHER RESIN COMPOSITION

This invention relates to a curable polyphenylene ether resin composition. More specifically, it relates to a curable polyphenylene ether resin composition capable of giving a cured resin having excellent adhesiveness, solvent resistance and electrical properties, said composition comprising a polyphenylene ether resin and a polyfunctional cyanate ester, a polyfunctional maleimide or a prepolymer of any of these.

With a recent advance in electrical and electronics appliances for communication, household and industry, there has been an increasing demand for simplifying methods of mounting such appliances, and accordingly it has been desired to develop electronics materials of light weight and high performance. Various investigations have been undertaken in the field of polymeric materials in order to meet this desire.

In particular, since a higher density of circuits has recently been achieved in printed circuit boards, it has been desired to use materials having better heat resistance, dimensional stability or electrical properties. Usually, copper-clad laminated boards based on thermosetting resins such as phenolic resins or epoxy resins are used as the printed circuit boards. Thermosetting resins previously used, however, generally have the defect of poor electrical properties, especially in the high frequency range.

On the other hand, many thermoplastic resins have excellent electrical properties, and attempts have been made to apply heat-resistant thermoplastic resins to electronics instruments and appliances. However, thermoplastic resins are generally inferior to thermosetting resins in heat resistance, solvent resistance, dimensional stability, etc., and their mechanical properties depend largely on temperature. This generally limits the uses of thermoplastic resins.

Polyphenylene ether resins are thermoplastic resins having excellent mechanical and electrical properties, and exhibit high heat resistance for thermoplastic resins. An attempt was made to produce a copper-clad material having a polyphenylene ether resin as a substrate by utilizing these properties (Japanese Patent Publication No. 25394/1976). When this copper-clad material is exposed to high temperatures, however, the resin is degraded and its impact strength or toughness is reduced rapidly. Moreover, with increasing temperature, its mechanical strength is reduced, and the material undergoes deformation. Furthermore, with increasing temperature, the adhesion strength of the copper foil decreases to cause undesirable phenomena such as swelling or peeling. Because of these defects, copper-clad materials based on polyphenylene ether resins have not yet gained commercial acceptance.

Polyphenylene ether resins are also widely used in fields which involve contact with city, agricultural and industrial waters by utilizing their strong resistance to acids, alkalies or hot water. But they have very poor resistance to aromatic hydrocarbons and halogenated hydrocarbons. Some methods have therefore been proposed to increase resistance to organic solvents. They include, for example, a method comprising curing a polyphenylene ether resin using a metal alcoholate as a catalyst (Japanese Patent Publication No. 29752/1969); a method comprising adding a crosslinking agent to a polyphenylene ether resin to form a three-dimensional network structure (U.S. Pat. No. 3,396,146); and a method comprising mixing a polyphenylene ether resin with a thermosetting resin, and curing the mixture (Japanese Patent Publication No. 15519/1975). According to these methods, the catalyst, the crosslinking agent or the thermosetting resin is decomposed at high temperatures (required for molding) which are near the melting point of the polyphenylene ether resin. This results in molded articles which are discolored or degenerated or contain foams. Accordingly, these methods have not yet been accepted commercially.

It is an object of this invention to provide a curable polyphenylene ether resin composition capable of giving a cured resin having much higher solvent resistance than the polyphenylene ether resin while substantially retaining the inherent properties, especially electrical properties, of the polyphenylene ether even if these electrical properties are not improved.

Another object of this invention is to provide a curable polyphenylene ether resin composition capable of giving a cured resin having such electrical properties and solvent resistance and exhibiting excellent adhesiveness to a foil of a metal such as copper.

Still another object of this invention is to provide a curable polyphenylene ether resin composition capable of giving a cured resin having such electrical properties and solvent resistance and exhibiting better mechanical properties, particularly higher impact strength, than the polyphenylene ether resin.

Yet another object of this invention is to provide a cured resin from a polyphenylene ether resin composition having the aforesaid properties.

Other objects and advantages of this invention will become apparent from the following description.

The objects and advantages of this invention are achieved by a curable polyphenylene ether resin composition comprising (a) a polyphenylene ether resin, and
(b) at least one polyfunctional compound selected from the group consisting of polyfunctional maleimides represented by the general formula

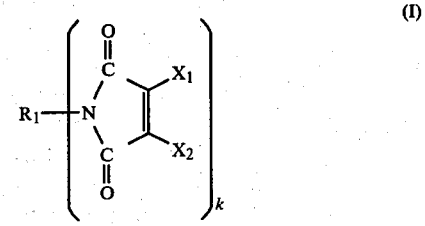

(I)

wherein k is an integer of at least 2, $X_1$ and $X_2$ are identical or different, and each represents a hydrogen atom, a halogen atom or a lower alkyl group, and $R_1$ is an aromatic or aliphatic organic group having a valence of k, or prepolymers thereof, polyfunctional cyanate esters represented by the general formula $$R_2-O-C\equiv N)_l \quad (II)$$

wherein l is an integer of at least 2, and $R_2$ represents an aromatic organic group having a valence of l, provided that the groups $-O-C\equiv N)_l$ are directly bonded to the aromatic ring of the organic group, or prepolymers thereof, and pre-copolymers of the polyfunctional maleimides and the polyfunctional cyanate esters.

The polyphenylene ether resin used in this invention may be any of known polyphenylene ether resins. For example, there can be used polymers obtained by polycondensing monocyclic phenols of the general formula

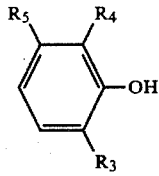

(III)

wherein $R_3$ and $R_4$ are identical or different and represent an alkyl group having 1 to 3 carbon atoms, and $R_5$ represent a hydrogen atom or an alkyl group having 1 to 3 carbon atoms. Methods of polycondensation are well known per se. These polymers have in the polymer chain skeleton recurring units of the following formula

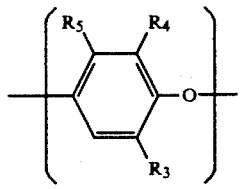

(IV)

wherein $R_3$, $R_4$ and $R_5$ are as defined above.

The alkyl group having 1 to 3 carbon atoms represented by $R_3$, $R_4$ and $R_5$ in formula (III) and (IV) are specifically methyl, ethyl, n-propyl and iso-propyl group, the methyl group being preferred.

The polyphenylene ether resins used in this invention may be homopolymers and copolymers. Examples include homopolymers typified by poly(2,6-dimethyl-1,4-phenylene)ether, poly(2-methyl-6-ethyl-1,4-phenylene)ether and poly(2,5-dimethyl-1,4-phenylene)ether; and copolymers typified by a copolymer derived from 2,6-dimethylphenol and 2,3-6-trimethylphenol or a copolymer derived from 2-methyl-6-ethylphenol and 2,3,6-trimethylphenol. Among these, poly(2,6-dimethyl-1,4-phenylene)ether and the 2,6-dimethylphenol/2,3,6-trimethylphenol copolymer are especially useful as practical polyphenylene ether resins. Desirably, these polyphenylene ether resins have a number average molecular weight of about 1,000 to about 30,000. Polyphenylene ether resins having a relatively low molecular weight have good solubility and lend themselves to good handling, and on the other hand, polyphenylene ether resins having a relatively high molecular weight improve the mechanical properties of the resin composition. Thus, depending upon these properties, the polyphenylene ether resin is properly selected to suit particular uses.

The polyfunctional maleimides in the composition of this invention are expressed by the following general formula

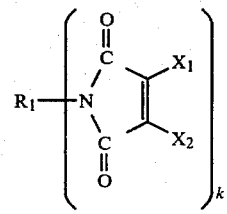

(I)

wherein k is an integer of at least 2, $X_1$ and $X_2$ are identical or different and each represents a hydrogen atom, a halogen atom or a lower alkyl group, $R_1$ represents an aromatic or aliphatic organic group having a valence of k.

The important structure in the polyfunctional maleimides which is conducive to the achievement of the objects of this invention is that the polyfunctional maleimides have at least two maleimide groups represented by the parenthesized portion of formula (I).

In formula (I), $X_1$ and $X_2$, independently from each other, represent a hydrogen atom, a halogen atom or a lower alkyl group. The halogen atom is preferably chlorine or bromine. The lower alkyl group is preferably an alkyl group having 1 to 4 carbon atoms such as methyl, ethyl, n-propyl, iso-propyl or n-butyl.

$R_1$ in formula (I) is an aromatic or aliphatic polyvalent organic group. The valence of the organic group is equal to the value of k which is usually from 2 to 10, preferably 2 to 4. The aliphatic polyvalent organic group is preferably a liner or cyclic aliphatic hydrocarbon group having 4 to 16 carbon atoms. Examples of the aromatic polyvalent organic group are polyvalent (preferably divalent) monocyclic or fused ring aromatic hydrocarbon groups such as a benzene ring, a naphthalene ring an anthracene ring, or a pyrene ring; polyvalent polybenzene groups resulting from bonding of a plurality of benzene rings either directly or through a bridging member, represented by the formula

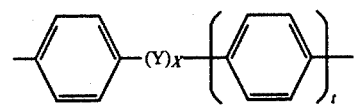

(V)

wherein x represents 0 or 1 and when x represents 1, Y represents a di or tri valent bridging member, preferably divalent bridging member, for example a linear, branched or cyclic aliphatic hydrocarbon group having 1 to 14 carbon atoms, a phenylene group, a xylylene group, an oxygen atom, a sulfur atom, a carbonyl group, a sulfonyl group, a sulfinyl group, an alkyleneoxyalkylene group a phosphonyl group, a phosphinyl group or an imino group, and t is an integer of or 2; a triazine ring; and a residue obtained by removing the amino group from a polynuclear product of benzene, preferably a binuclear to decanuclear product of benzene, which is a condensation product between aniline and formaldehyde. In $R_1$ of formula (I) the linear aliphatic hydrocarbon group may be replaced by an inert substituent, for example, an alkoxy group, preferably having 1 to 4 carbon atoms, and the cyclic aliphatic or aromatic hydrocarbon group and a polybenzene group may be replaced by an alkyl group preferably having 1 to 4 carbon atoms, or an alkoxy group preferably having 1 to 4 carbon atoms.

To avoid complexity in expression, specific examples of $R_1$ are expressed in terms of compounds representing the basic structure. They include diphenylmethane, diphenylpropane, diphenyl ether, diphenyldimethylene ether, diphenyl thioether, diphenylketone, diphenylamine, diphenyl sulfoxide, diphenylsulfone, triphenyl phosphite, and triphenyl phosphate. Specific examples of the aliphatic polyvalent organic group will be self-evident.

Generally, compositions of this invention comprising the polyfunctional maleimides of general formula (I) in which $R_1$ is an aliphatic group impart flexibility or suppleness to the resulting cured resins, and compositions of this invention comprising the polyfunctional maleimide of general formula (I) in which $R_1$ is an aromatic group impart excellent heat resistance to the cured resins. The compounds of general formula (I) may be used singly or as a mixture of two or more in the resin composition of this invention.

Preferably, there are used in this invention polyfunctional maleimides of the following formula

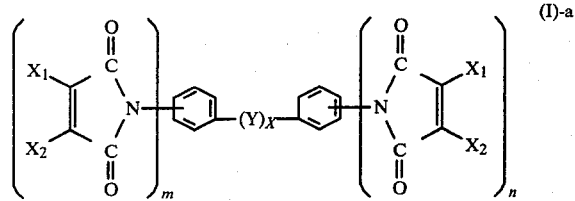

wherein $X_1$, $X_2$ and $(Y)_x$ are as defined hereinabove, and $m+n$ is equal to $k$ which is an integer of 2 to 10.

Polyfunctional maleimides of formula (I)-a in which x represents 0 or 1 and when x represents 1, Y represents a methylene group are preferred, and those of formula (I)-a in which, x represents 0 or 1 and when x represents 1, Y represents a methylene group and m and n are 1, are especially preferred.

These polyfunctional maleimides can be produced by a method known per se which comprises reacting a maleic acid with a polyamine having at least two amino groups to prepare a polymaleamide acid, and then dehydrocyclizing the polymaleamide acid.

Examples of the polyamines used to prepare the polyfunctional maleimides of formula (I) include m- or p-phenylenediamine, m- or p-xylylene diamine, 1,4- or 1,3-cyclohexanediamine, hexahydroxylylenediamine, 4,4′-diaminobiphenyl, bis(4-aminophenyl)methane, bis(4-aminophenyl)ether, bis(4-aminophenyl)sulfone, bis(4-amino-3-methylphenyl)methane, bis(4-amino-3,5-dimethylphenyl)methane, bis(4-amino-3-chlorophenyl)methane, bis(4-aminophenyl)cyclohexane, 2,2-bis(4-aminophenyl)propane, 2,2-bis(4-amino-3-methylphenyl)propane, 2,2-bis(3,5-dibromo-4-aminophenyl)propane, bis(4-aminophenyl)phenylmethane, 3,4-diaminophenyl-4′-aminophenylmethane, 1,1-bis(4-aminophenyl)phenylethane, melamine having an s-triazine ring, and a polynuclear polyamine obtained by reacting aniline with formaldehyde to bond the benzene rings by a methylene linkage.

In the known methods for preparing the polyfunctional maleimides, the use of a primary amine such as those shown above as the polyamine results in desirable proceeding of the reaction.

The composition of this invention may contain the polyfunctional maleimide in the form of a prepolymer. The prepolymer denotes a pre-homopolymer, a pre-copolymer or an amine-modified prepolymer obtained by a method known per se which comprises reacting at least one polyfunctional maleimide under heat, if desired together with a polyamine having at least two amino groups in the molecule, and stopping it before the reaction mixture is gelled.

The polyfunctional cyanate ester used in the composition of this invention is expressed by the following general formula

wherein $l$ is an integer of at least 2, and $R_2$ represents an aromatic organic group having a valence of $l$, provided that the groups $-O-C\equiv N)_l$ are directly bonded to the aromatic ring of the organic group.

The important structure in the polyfunctional cyanate ester which is conducive to the achievement of the objectives of this invention is that it has at least two $-O-C\equiv N$ groups directly attached to the aromatic ring.

$R_2$ in formula (II) is a polyvalent aromatic organic group which may be the same as those exemplified hereinabove with regard to $R_1$ in general formula (I). Specifically, they include polyvalent, preferably divalent, monocyclic or fused ring aromatic hydrocarbon groups such as a benzene ring, a naphthalene ring, an anthracene ring or a pyrene ring; a polyvalent polybenzene groups resulting from the bonding of a plurality of benzene rings through a bond or a bridging member, preferably the polyvalent polybenzene groups having a bridging member represented by formula (V); and a residue obtained by removing the hydroxyl group from a polynuclear product of benzene, preferably a binuclear to a decanuclear product of benzene, which is a condensation product between phenol and formaldehyde.

The aromatic ring of the aromatic organic group may be substituted by an alkyl group preferably having 1 to 4 carbon atoms, or an alkoxy group preferably having 1 to 4 carbon atoms.

To avoid complexity in expression, specific examples of $R_1$ are expressed by compounds representing the basic structure. They include diphenylmethane, 2,2-diphenylpropane, diphenyl ether, diphenyldimethylene ether, diphenyl thioether, phenylketone, diphenylamine, diphenylsulfoxide, diphenylsulfone, triphenyl phosphite, and triphenyl phosphate.

Preferred polyfunctional cyanate esters which can be used in this invention are polycyanatobenzenes of the formula

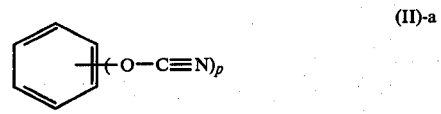

wherein p is an integer of 2 or 3, polycyanatonaphthalenes of the formula

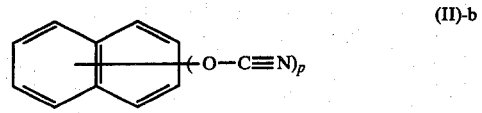

wherein p is as defined above, polycyanatobiphenyls of the formula

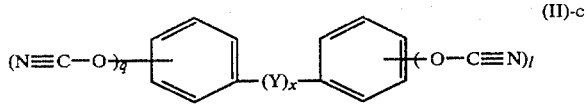

(II)-c wherein (Y)$_x$ is the same as in formula (V), q or r is 0 or an integer of 1 to 3 provided that q+r is an integer of 2 or 3, and polycyanate compounds obtained by reacting a pre-condensate of phenol and formaldehyde with a cyanogen halide.

Among them, the polycyanatobiphenyls of formula (II)-c are preferred. More preferably, q and r in formula (II)-c are 1. Polycyanatobiphenyls of formula (II)-c in which q and r are 1 and Y is (CH$_3$)$_2$C<, and the polycyanate compounds obtained by reacting the pre-condensate of phenol and formaldehyde with cyanogen halides are especially preferred.

Examples of the polyfunctional cyanate esters of general formula (II) include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-cyanatophenyl)methane, 2,2-bis(4-cyanatophenyl)propane, 2,2-bis(3,5-dichloro-4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate, and polycyanate compounds obtained by reacting the pre-condensate of phenol and formaldehyde, with cyanogen halides.

Polycyanate compounds of polynuclear products of benzene obtained by the reaction of phenolic resins with cyanogen halides (for example, Japanese Patent Publications Nos. 11712/1970 and 9433/1980), and the cyanate esters described, for example, in Japanese Patent Publications Nos. 1928/1965, 18468/1968, 4791/1969, 15516/1971, 41112/1971 and 26853/1972 and Japanese Laid-Open Patent Publication No. 63149/1976 also fall into the category of the polyfunctional cyanate esters used in this invention. Accordingly, the disclosures of these Japanese patent documents are herein cited as references.

Generally, the polyfunctional cyanate esters of general formula (II) can be prepared by a known method which comprises reacting polyhydric phenols with cyanogen halides (see, for example, Japanese Patent Publication No. 1928/1966).

The composition of this invention may also contain the polyfunctional cyanate ester in the form of a prepolymer. The prepolymer includes, for example, a pre-homopolymer, and a pre-copolymer obtained by polymerizing polyfunctional cyanate esters under heat in the presence or absence of catalysts, for example mineral acids, Lewis acids, salts such as sodium carbonate or lithium chloride, and phosphate esters such as tributylphosphine. The prepolymers contain in the molecule a symtriazine ring formed by the trimerization of the cyano group in the cyanate esters. The prepolymers preferably have an average molecular weight of 400 to 6,000. For example, a "cyanate ester resin" commercially available is a mixture of 2,2-bis(4-cyanatophenyl)-propane obtained from bisphenol A and a cyanogen halide and its prepolymer. Such "cyanate ester resin" is used preferably in this invention.

The prepolymer may also include an amine-modified prepolymer. The amine-modified prepolymer can be produced by a method known per se which comprises reacting the polyfunctional cyanate ester with a polyamine such as phenylenediamine, xylylenediamine, cyclohexanediamine, 4,4'-diaminobiphenyl, bis(4-aminophenyl)methane, 2,2-bis(4-aminophenyl)propane or bis(4-aminophenyl)ether under heat and stopping it before the reaction mixture is gelled.

The composition of this invention may also contain the polyfunctional maleimide and the polyfunctional cyanate ester in the form of a pre-copolymer. The pre-copolymer may be produced by the same method as the method for producing the prepolymer of the polyfunctional maleimide or the polyfunctional cyanate ester.

Thus, the composition of this invention may contain at least one polyfunctional compound selected from the group consisting of (1) the polyfunctional maleimides of general formula (I) or the prepolymers thereof, (2) the polyfunctional cyanate esters of general formula (II) or the prepolymers thereof, and (3) the pre-copolymers of the polyfunctional maleimides of general formula (I) and the polyfunctional cyanate esters of formula (II).

The composition of this invention should contain the polyphenylene ether resin in an amount of about 2 to about 99% by weight, preferably about 4 to about 99% by weight, based on the total weight of the polyphenylene ether resin and the polyfunctional compound, provided that a cured product from the composition exhibits much the same electrical properties as the inherent electrical properties of the polyphenylene ether resin itself and has much higher solvent resistance than the polyphenylene ether resin itself. Conversely, this means that the polyfunctional compound should be included in an amount of about 1 to about 98% by weight based on the total weight of the polyphenylene ether resin and the polyfunctional compound.

The composition of this invention preferably has the following constituent proportions in order for it to give a cured product having excellent adhesion to metal foils or excellent impact strength in addition to the aforesaid properties.

The composition of this invention comprising the polyfunctional maleimide or its prepolymer (1) above as the polyfunctional compound contains this polyfunctional compound in an amount of about 1 to about 70% by weight based on the total weight of the polyphenylene ether resin and the polyfunctional maleimide and/or its prepolymer. Generally, a cured product obtained from the polyfunctional maleimide or its prepolymer tends to be brittle. However, in the composition of this invention, even if the amount of the polyfunctional maleimide or its prepolymer is relatively large, mixing of it with a suitable amount of the polyphenylene ether resin gives a composition which will lead to a cured product having excellent properties. Accordingly, the composition containing a relatively large amount of the polyfunctional maleimide component is useful as a master batch for production of the composition of this invention having constituent proportions which give the desired cured products and also in the production of the composition of this invention containing both the polyfunctional maleimide component and the polyfunctional cyanate ester component to be described hereinbelow.

The composition of this invention comprising the polyfunctional cyanate ester or its prepolymer (2) alone as the polyfunctional compound contains this compound in an amount of 1 to about 95% by weight based on the total weight of the polyphenylene ether resin and the polyfunctional cyanate ester and/or its prepolymer.

Even when the polyfunctional cyanate ester or its prepolymer is contained in a relatively large amount, the impact strength of the resulting cured products is not reduced but upgraded. The composition of this invention comprising both the maleimide unit and the cyanate ester unit contains about 2 to about 96% by weight of these units based on the total weight of the polyphenylene ether resin and the polyfunctional compounds. The amounts of the polyfunctional maleimide unit and the polyfunctional cyanate ester unit are about 1 to about 85% by weight and about 3 to about 97% by weight, respectively, on the same basis.

The resin composition of this invention may contain various additives for the purpose of controlling the thermosettability of the resulting resin composition, modifying the properties of the resin itself, or imparting the desired properties to the final resin product (cured product). Furthermore, since the resin composition of this invention forms a crosslinked network structure by reaction under heat or pressure, a catalyst may be included into the composition in order to promote the formation of the crosslinked network structure. Examples of the catalyst include organic acid metal salts such as lead naphthenate, lead stearate, zinc, octylate, zinc naphthenate, tin oleate, dibutyltin maleate, manganese naphthenate, cobalt naphthenate and a lead salt of resin acid; metal chlorides such as $SnCl_4$, $ZnCl_2$ and $AlCl_3$; and organic bases such as triethylenediamine. The amount of the catalyst depends largely on the type of the catalyst, the curing conditions, or the use of the final cured product. Usually, it is not more than 5% by weight based on the total resin solid.

Natural, semi-synthetic or synthetic resins may be included into the resin composition of this invention to impart the desirable properties according to its uses. The amounts of these resins are those which do not deteriorate the inherent properties of the composition. Examples of such resins are oleoresins such as drying oils and non-drying oils, rosin, shellac, copal, oil-modified rosin, phenolic resins, alkyd resins, epoxy resins, urea resins, melamine resins, polyester resins, vinyl butyral resins, vinyl acetate resins, vinyl chloride resins, acrylic resins, silicone resins and rubbers. They are used singly or as a mixture of two or more.

Polyamines may also be incorporated into the resin composition of this invention. The polyamines serve to induce a reaction of forming an amine-modified prepolymer during the curing of the resin composition of this invention.

If desired, reinforing materials or fillers in fibrous or powdery form may be included. Examples of the powdery reinforcing materials or fillers are carbon black, finely divided silica, fired clay, basic magnesium silicate, powdery diatomaceous earth, alumina, calcium carbonate, magnesium carbonate, magnesium oxide, kaolin, sericite and boron nitride.

Examples of the fibrous reinforcing material include inorganic fibers such as ceramic fibers, asbestos, rockwool, glass fibers, slag wool and carbon fibers, natural and synthetic fibers such as paper, pulp, wood flour, cotton, linter and polyimide fibers. The fibrous reinforcing materials may be used in the form of chopped fibers, staples, tows, webs, woven fabrics, non-woven fabrics or sheets. The amount of the reinforcing material or the filler varies depending upon the uses of the final product. When it is used as a laminating material or molding material, the reinforcing material or the filler may be used in an amount of up to 400 parts by weight per 100 parts by weight of the resin solid. For flame retarding purposes, the resin composition of this invention may also comprise flame retardants known for polyphenylene ether resins, for example, phosphate esters, halogenated organic compounds and combinations of halogen-containing compounds and antimony compounds.

For coloring purposes, the resin composition of this invention may include white pigments such as titanium dioxide, and coloring pigments or various organic dyes and pigments, such as lead yellow, carbon black, iron black, molybdenum red, prussian blue, navy blue, cadmium yellow and cadmium red.

When the resin composition of this invention is to be used in paint applications, it may contain known paint additives, for example rust-proofing pigments such as zinc chromate, red lead, red iron oxide, zinc, and strontium chromate; antisagging agents such as aluminum stearate; dispersants; thickeners; film modifying agents; extender pigments; and fire retardants.

The resin composition of this invention may be easily produced by a known method for mixing a thermoplastic resin in the molten state. For example, it can be generally produced conveniently by a method which comprises mixing the polyphenylene ether resin with predetermined amounts of at least one polyfunctional compound and the other optional components in a mixer, fully kneading the resulting mixture in a melt-extruder, and pelletizing the uniform molten mass or molding it into a molded article.

The resin composition of this invention can be applied to various uses as mentioned hereinabove. Accordingly, various processing methods can be applied according to the uses. For example, in addition to forming the resin composition into a molded article, the resin composition may be formulated into a paint or an adhesive, which may be coated on a substrate. Or the resin composition may be impregnated into a powdery substrate to form a molding material which is then subjected to shell molding. Or the composition may be impregnated in a fibrous reinforcing material to form a molding material which is then laminated.

The method of curing the resin composition of this invention is not restricted in particular. Usually, it is performed by heating. Generally, a temperature of about 50° to about 400° C., preferably a temperature of about 100 to about 330° C., is selected. The time required for curing differs depending upon the form in which the resin composition of this invention is used, i.e. depending upon whether it is a thin film, or a relatively thick molded article or laminate. Usually, a period sufficient for curing of the resin composition may be selected from the range of 30 seconds to 10 hours. When the resin composition of this invention is to be used molded articles, laminates or bonded structures, it is desirable to apply pressure during the heat curing mentioned above.

Other curing methods involve use of ionizing radiations electron beams from various types of accelerators, gamma-rays from isotopes such as cobalt 60; sunlight; and active energy, for example light radiated from a light source such as a tungsten lamp, or a low-pressure or high-pressure mercury lamp. In the case of photocuring, the resin composition of this invention may contain up to 5% by weight, based on the resin solid, of a known photosensitizer, for example, an organic carbonyl compound such as benzoin, benzoin methyl ether, benzathrone, anthraquinone and benzophenone, or a combination of a sensitizing dye such as eosine, erythrosine or acridine with an amine. Such a photocurable resin composition containing a photosensitizer is effective in coating applications.

Cured articles obtained from the resin composition of this invention have far better solvent resistance than the polyphenylene ether resin.

For example, as shown in Examples given hereinbelow, cured articles obtained by molding under pressure at 260° C. for 1 hour of a resin composition in accordance with this invention consisting of 90 parts by weight of the polyphenylene ether resin and 10 parts by weight of the polyfunctional maleimide and a resin composition in accordance with this invention consisting of 90 parts by weight of the polyphenylene ether resin and 10 parts of the polyfunctional cyanate ester are extracted only to an extent of about 20% and about 35%, respectively, when treated with chloroform for 18 hours in a Soxhlet extractor. In contrast, the polyphenylene ether resin alone is extracted to an extent of 99% or more under the same conditions as above.

It was beyond expectation that the cured products obtained from the resin composition of this invention show such excellent solvent resistance. In view of the fact that the polyphenylene ether resin has relatively low reactivity, one can hardly imagine that the polyphenylene ether resin would participate in the curing reacton. If the polyphenylene ether resin is in fact not involved in the curing reaction, it is difficult to explain why the extent of solvent extraction of the resin composition of the invention is so much decreased. We presume that the curing reaction of the composition of the invention is a reaction of forming a crosslinked network structure, in which the polyfunctional maleimide or the polyfunctional cyanate ester participates. The details of the reaction mechanism, however, have not been elucidated.

A cured article obtained from the composition of the invention composed comprising the polyphenylene ether resin, the polyfunctional maleimide component and the polyfunctional cyanate ester component has excellent adhesion to metals, excellent mechanical properties such as impact strength, and excellent electrical properties.

Because of the aforesaid properties of the cured articles, the resin composition of this invention find application in various fields, including paints for rust-proofing, fire and flame retarding and the like purposes, electrical insulating varnishes, adhesives, molding materials, various laminating materials including fiber-reinforced laminates, and materials for printed circuit boards.

The following Examples and Comparative Examples illustrate the present invention more specifically. Unless otherwise specified, all parts and percentages in these examples are by weight.

EXAMPLES 1 to 5 and COMPARATIVE EXAMPLES 1 to 5

Nintey parts of a phenylene ether copolymer (a random copolymer derived from 95 mole% of 2,6-dimethylphenol and 5 mole% of 2,3,6-trimethylphenol on monomer basis) having an intrinsic viscosity, measured at 25° C. in chloroform, of 0.18 dl/g (Example 1), 0.23 dl/g (Example 2), 0.34 dl/g (Example 3), 0.50 dl/g (Example 4) and 0.57 dl/g (Example 5), respectively, and 10 parts of bismaleimide prepared from maleic anhydride and bis(4-aminophenyl)methane were fully mixed in a Henschel mixer. The mixture was compression-molded at 230° to 300° C. and 100 kg/cm² for 1 hour. A square sample, each side measuring 3 mm, was cut out from the resulting article, and extracted continuously with chloroform for 18 hours in a Soxhlet extractor. The percentage of the residue insoluble in chloroform based on the weight of the sample before extraction was determined. The results are shown in Table 1.

Table 1 also shows the results obtained by using compression-moled articles of the phenylene ether copolymers alone.

TABLE 1

| | Amount of the polyphenylene ether resin (parts) | Amount of bis-maleimide (parts) | Intrinsic viscosity of the polyphenylene ether resin (dl/g) | Molding temperature (°C.) | Proportion of the residue (%) |
|---|---|---|---|---|---|
| Example | | | | | |
| 1 | 90 | 10 | 0.18 | 230 | 26 |
| 2 | 90 | 10 | 0.23 | 245 | 46 |
| 3 | 90 | 10 | 0.34 | 260 | 85 |
| 4 | 90 | 10 | 0.50 | 270 | 100 |
| 5 | 90 | 10 | 0.57 | 300 | 100 |
| Comp. Example | | | | | |
| 1 | 100 | 0 | 0.18 | 230 | 0 |
| 2 | 100 | 0 | 0.23 | 245 | 0 |
| 3 | 100 | 0 | 0.34 | 260 | 0 |
| 4 | 100 | 0 | 0.50 | 270 | <1 |
| 5 | 100 | 0 | 0.57 | 300 | 3 |

The results demonstrate improved solvent resistance brought about by the addition of the polyfunctional maleimides.

EXAMPLES 6 to 9 and COMPARATIVE EXAMPLES 6 to 9

Eighty parts of poly(2,6-dimethyl-1,4-phenylene) ether having an intrinsic viscosity, measured at 25° C. in chloroform, of 0.20 dl/g (Example 6), 0.30 dl/g (Example 7), 0.45 dl/g (Example 8), and 0.60 dl/g (Example 9), respectively, and 20 parts of bismaleimide prepared from maleic anhydride and bis(4-aminophenyl)methane were fully mixed in a Henschel mixer. The mixture was compression-molded at 240° to 290° C. and 100 kg/cm² for 1 hour. A square sample, each side measuring 3 mm, was cut out from the molded article, and extracted with chloroform continuously for 18 hours in a Soxhlet extractor. The proportion of the residue insoluble in chloroform was determined. The results are shown in Table 2. Table 2 also shows the results obtained by using compression-molded articles of poly(2,6-dimethyl-1,4-phenylene)ether alone.

TABLE 2

| | Amount of the polyphenylene ether resin (parts) | Amount of bis-maleimide (parts) | Intrinsic viscosity of the polyphenylene ether resin (dl/g) | Molding temperature (°C.) | Proportion of the residue (%) |
|---|---|---|---|---|---|
| Example | | | | | |
| 6 | 80 | 20 | 0.20 | 240 | 63 |
| 7 | 80 | 20 | 0.30 | 250 | 96 |
| 8 | 80 | 20 | 0.45 | 270 | 100 |
| 9 | 80 | 20 | 0.60 | 290 | 100 |
| Comp. Example | | | | | |
| 6 | 100 | 0 | 0.20 | 240 | 0 |
| 7 | 100 | 0 | 0.30 | 250 | 0 |

TABLE 2-continued

| | Amount of the poly-phenylene ether resin (parts) | Amount of bis-maleimide (parts) | Intrinsic viscosity of the poly-phenylene ether resin (dl/g) | Molding temperature (°C.) | Proportion of the residue (%) |
|---|---|---|---|---|---|
| 8 | 100 | 0 | 0.45 | 270 | <1 |
| 9 | 100 | 0 | 0.60 | 290 | 3 |

EXAMPLE 10

Eighty-five parts of a phenylene ether copolymer (a random copolymer derived from 95 mole% of 2,6-dimethylphenol and 5 mole% of 2,3,6-trimethylphenol on monomer basis) having an intrinsic viscosity, measured at 25° C. in chloroform, of 0.30 dl/g and 15 parts, calculated as solids content, of a bismaleimidediamine prepolymer solution (KERIMID-601, a product of Rhone-Poulenc; N-methylpyrrolidone solution; average molecular weight 1200 to 1400) were mixed fully in a Henschel mixer. The mixture was dried in vacuum to remove the N-methyl pyrrolidone, and compression-molded at 260° C. and 50 kg/cm² for 1 hour. A square sample, each side measuring 3 mm, was cut out from the molded article, and extracted with chloroform continuously for 18 hours in a Soxhlet extractor. The proportion of the residue insoluble in chloroform was 50%.

EXAMPLE 11

Seventy-five parts of poly(2,6-dimethyl-1,4-phenylene)ether having an intrinsic viscosity, measured at 25° C. in chloroform, of 0.30 dl/g and 25 parts of a prepolymer of poly(phenylmethylene)polymaleimide (prepared as below) were fully mixed in a Henschel mixer. The mixture was compression-molded at 260° C. and 100 kg/cm² for 1 hour. A square sample, each side measuring 3 mm, was cut out from the molded article, and extracted with chloroform continuously for 18 hours in a Soxhlet extractor. The proportion of the residue insoluble in chloroform was 90%.

The prepolymer of poly(phenylmethylene)-polymaleimide used was prepared as follows:

Thirty parts of maleic anhydride was dissolved in 250 parts of acetone, and a solution of 30 parts of poly(-phenylmethylene)polyamine having three aniline residues on an average in the molecule (MDA-150, a trademark for a product of Mitsui Toatsu Chemicals Inc.) in 60 parts of acetone was added gradually to the solution with stirring to form a precipitate. By infrared absorption spectroscopy, this precipitate was determined to be maleamide acid of poly(phenylmethylene)polyamine.

To the reaction mixture containing the precipitate were added 1 part of cobalt acetate tetrahydrate, 6 parts of triethylamine and 40 parts of acetic anhydride, and the mixture was heated under reflux for 1.5 hours. A greater portion of the acetone was removed, and the residue was poured into a large amount of water. The precipitate was separated by filtration, washed with water, and dried to give a yellowish brown powdery product. The powdery product was determined by nuclear magnetic resonance spectroscopy, infrared absorption spectroscopy and molecular weight measurement by the vapor pressure method to be poly(phenylmethylene)polymaleimide having three N-phenylmaleimide groups on an average in the molecule. Fifty parts of the resulting poly(phenylmethylene)polymaleimide and 20 parts of MDA-150 were mixed, and heated at 150° C. for 15 minutes to form a prepolymer as a viscous product.

EXAMPLE 12

Ninety-five parts of a phenylene ether copolymer (a random copolymer derived from 95 mole% of 2,6-dimethylphenol and 5 mole% of 2,3,6-trimethylphenol on monomer basis) having an intrinsic viscosity, measured at 25° C. in chloroform, of 0.34 dl/g, 5 parts of bismaleimide prepared from maleic anhydride and bis(4-aminophenyl)ether, and 0.2 part of carbon black as a pigment were fully mixed in a Henschel mixer. The mixture was compression-molded at 260° C. and 50 kg/cm² for 1 hour. A square sample, each side measuring 3 mm, was cut out from the molded article, and extracted with chloroform continuously for 18 hours in a Soxhlet extractor. The proportion of the residue insoluble in chloroform was 32%.

EXAMPLE 13

Eighty-five parts of poly(2,6-dimethyl-1,4-phenylene)ether having an intrinsic viscosity, measured at 25° C. in chloroform, of 0.33 dl/g, 10 parts of the same bismaleimide as used in Examples 1 to 5, 5 parts of trismaleimide of the following formula

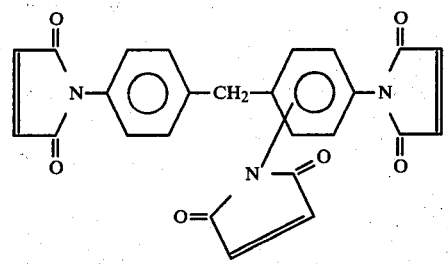

and 1 part of titanium dioxide as a pigment were fully mixed in a Henschel mixer. The mixture was compression-molded at 260° C. and 200 kg/cm² for 1 hour.

A square sample, each side measuring 3 mm, was cut out from the molded article, and extracted with chloroform continuously for 18 hours in a Soxhlet extractor. The proportion of the residue insoluble in chloroform was 93%.

EXAMPLE 14

Fifty parts of a phenylene ether copolymer (a random copolymer derived from 95 mole% of 2,6-dimethylphenol and 5 mole% of 2,3,6-trimethylphenol on monomer basis) having an intrinsic viscosity, measured at 25° C. in chloroform, of 0.50 dl/g, 50 parts of the same bismaleimide as used in Examples 1 to 5, 30 parts of silica, 0.3 part of organopolysiloxane as a mold releasing agent, 4 parts of decabromobisphenyl ether and 1 part of antimony oxide were mixed in a Henschel mixer. The mixture was compression-molded at 260° C. and 100 kg/cm² for 1 hour to form a square sample having a thickness of 1.6 mm and each side measuring 10 cm. A square test piece each side measuring 3 mm was cut off from the sample, and extracted with chloroform continuously for 18 hours in a Soxhlet extractor. The test piece was not extracted with chloroform, and completely remained unextracted with chloroform.

A rectangular test piece having a width of 12.7 mm and a length of 100 mm was cut out from the sample, and subjected to a vertical burning test. It showed a fire retardancy corresponding to 94V-1 in accordance with the Underwriters Laboratory (UL) standards.

EXAMPLES 15 to 22 and COMPARATIVE EXAMPLES 10 and 11

The same polyphenylene ether resin as used in Example 12 and the same bismaleimide as used in Examples 1 to 5 were mixed in the proportions shown in Table 3 in a Henschel mixer. The mixture was placed in a thickness of 1.5 to 1.6 mm between two copper foils, and the assembly was compression-molded at 250° to 260° C. and 150 kg/cm² to prepare a test specimen copper-clad on both surfaces. The test specimen was subjected to various tests, and the results are shown in Table 3.

For comparison, test specimens copper-clad on both surfaces were prepared by using the polyphenylene ether resin and the bismaleimide singly, and subjected to the same tests as above (Comparative Examples 10 and 11). The results are also shown in Table 3. It was found that the test specimens prepared in these Comparative Examples were brittle and their properties could not be measured by the tests indicated.

decay-type viscoelasticity measuring device (RHESCA, RD1100A-type)".

(3) Flexural strength

The copper foils were peeled off, and a test piece, 25 mm wide and about 70 mm long, was cut out. While maintaining the distance between fulcra at 50 mm, the flexural strength of the test piece was measured by an autograph (Model 1S-5000, a product of Shimazu Seisakusho).

(4) Izod impact strength

The copper foils were peeled off, and a test piece, 12.5 mm wide and 50 mm long, was cut out. Without forming a notch, the Izod impact strength of the test piece was measured by an Izod impact tester.

(5) Peel strength of the copper foil

Parallel cuts with a width of 10 mm were provided on the copper foil surface, and then the copper foils were peeled off in a direction at right angles to the copper foil surface. The stress upon peeling was measured by a

TABLE 3

| | Comp. Example 10 | Example 15 | Example 16 | Example 17 | Example 18 | Example 19 | Example 20 | Example 21 | Example 22 | Comp. Example 11 |
|---|---|---|---|---|---|---|---|---|---|---|
| Amount of the polyphenylene ether resin (parts) | 100 | 99 | 98 | 95 | 90 | 75 | 50 | 40 | 30 | 0 |
| Amount of bis-maleimide (parts) | 0 | 1 | 2 | 5 | 10 | 25 | 50 | 60 | 70 | 100 |
| Proportion of the residue after extraction with chloroform (%) | 0 | — | 7 | 37 | 80 | 100 | 100 | 100 | 100 | 100 |
| Glass transition temperature (°C.) | 206 | — | 222 | 223 | 227 | 232 | 235 | 235 | — | — |
| Flexural strength (kg/cm) | 636 | 660 | 743 | 720 | 758 | 1052 | 772 | 719 | 630 | — |
| Izod impact strength (unnotched) (kg.cm/cm) | 5.2 | 5.6 | 6.0 | 5.8 | 7.4 | 9.0 | 12.9 | 5.5 | 4.0 | — |
| Peel strength of the copper foil (kg/cm) | 0.9 | 1.0 | 0.9 | 0.9 | 0.9 | 0.9 | 0.8 | 0.9 | 0.8 | — |
| Dielectric constant (1 MHz) | 2.4 | — | 2.2 | 2.3 | 2.4 | 2.6 | 2.6 | 2.3 | — | — |
| Dielctric loss tangent (1 MHz) | 0.0008 | — | 0.0009 | 0.0012 | 0.0023 | 0.0039 | 0.0057 | 0.0050 | — | — |

The various properties shown in Table 3 were measured by the following methods.

(1) Proportion of the residue after extraction with chloroform

A square sample, each side measuring about 3 mm, was extracted with chloroform continuously for 18 hours in a Soxhlet extractor, and the proportion in percent of the weight of the residue to the weight of the sample before extraction was calculated.

(2) Glass transition temperature

The copper foils were peeled off, and an elongated rod-like test specimen, 0.7 to 1.2 mm wide and about 70 mm long, was cut out. The glass transition temperature of the test specimen was measured by a "torsion free "Tension" tensile tester.

(6) Dielectric constant and dielectric loss tangent

The copper foils were peeled off, and a square sample, each side measuring 50 mm, was cut out. These properties of the sample were measured at 1 MHz using a dielectric loss measuring device.

EXAMPLES 23 to 27 and COMPARATIVE EXAMPLE 12

Ninety parts of a phenylene ether copolymer (a random copolymer derived from 95 mole% of 2,6-dimethylphenol and 5 mole% of 2,3,6-trimethylphenol on monomer basis) having each of the intrinsic viscosities measured at 25° C. in chloroform shown in Table 4 and 10 parts of 2,2-bis(4-cyanatophenyl)propane, a cyanate ester monomer prepared from bisphenol A and cyanogen halide, were fully mixed in a Henschel mixer. The mixture was compression-molded at 230° to 300° C. and 100 kg/cm² for 1 hour. A square sample, each side measuring 3 mm, was cut out from the molded article, and extracted with chloroform continuously for 18 hours in a Soxhlet extractor. The proportion of the residue insoluble in chloroform was calculated. The results are shown in Table 4.

For comparison, Table 4 also shows the results obtained by using a compression-molded article of the phenylene ether copolymer alone having an intrinsic viscosity of 0.13 dl/g. For data about compression-molded articles of the phenylene ether copolymers having the other intrinsic viscosities, see Comparative Examples 2 to 5 shown in Table 1.

TABLE 4

| | Amount of the polyphenylene ether resin (parts) | Amount of 2,2-bis-(4-cyanatophenyl)-propane (parts) | Intrinsic viscosity of the polyphenylene ether resin (dl/g) | Molding temperature (°C.) | Proportion of the residue (%) |
|---|---|---|---|---|---|
| Example | | | | | |
| 23 | 90 | 10 | 0.13 | 230 | 13 |
| 24 | 90 | 10 | 0.23 | 245 | 40 |
| 25 | 90 | 10 | 0.33 | 260 | 78 |
| 26 | 90 | 10 | 0.50 | 270 | 100 |
| 27 | 90 | 10 | 0.57 | 300 | 100 |
| Comp. Example | | | | | |
| 12 | 100 | 0 | 0.13 | 230 | 0 |

The results in Table 4 demonstrate that the addition of the polyfunctional cyanate esters improves the solvent resistance of polyphenylene ether resins.

EXAMPLES 28 to 31

Eighty parts of each of the same poly(2,6-dimethyl-1,4-phenylene)ethers as used in Examples 6 to 9 and 20 parts of the same 2,2-bis(4-cyanatophenyl)propane were fully mixed in a Henschel mixer. The mixture was compression-molded at 240° to 290° C. and 100 kg/cm² for 1 hour. A square sample, each side measuring 3 mm, was cut out from the resulting molded article, and extracted with chloroform continuously for 18 hours in a Soxhlet extractor. The proportion of the residue insoluble in chloroform was calculated. The results are shown in Table 5.

TABLE 5

| Example | Amount of the polyphenylene ether resin (parts) | Amount of the cyanate ester (parts) | Intrinsic viscosity of the polyphenylene ether resin (dl/g) | Molding temperature (°C.) | Proportion of the residue (%) |
|---|---|---|---|---|---|
| 28 | 80 | 20 | 0.20 | 240 | 55 |
| 29 | 80 | 20 | 0.30 | 250 | 93 |
| 30 | 80 | 20 | 0.45 | 270 | 100 |
| 31 | 80 | 20 | 0.60 | 290 | 100 |

A comparison of the results given in Table 5 with those of Comparative Examples 6 to 9 given in Table 2 clearly shows that the solvent resistance of the cured products in Examples 28 to 31 show a marked improvement.

EXAMPLE 32

Sixty parts of a phenylene ether copolymer (a random copolymer derived from 95 mole% of 2,6-dimethylphenol and 5 mole% of 2,3,6-trimethylphenol on monomer basis) having an intrinsic viscosity, measured at 25° C. in chloroform, of 0.50 dl/g, 57 parts (40 parts as solids) of a prepolymer derived from 2,2-bis(4-cyanatophenyl)propane (a 70% methyl ethyl ketone solution; KL3-4000, a trademark for a product of Bayer AG), 30 parts of silica, 0.2 part of organopolysiloxane as a mold releasing agent, 4 parts of decabromobisphenol ether as a fire retardant, 1 part of antimony oxide and 0.1 part of zinc octylate (8% Zn) were uniformly mixed in a Henschel mixer. The mixture was dried in vacuum to remove methyl ethyl ketone, and then compression-molded at 260° C. and 100 kg/cm² for 2 hours to form a square test specimen having a thickness of 1.6 mm and each side measuring 10 cm. A square test piece, each side measuring 3 mm, was cut out from the test specimen, and extracted with chloroform continuously for 18 hours in a Soxhlet extractor. The test piece remained totally unextracted.

A test piece, 12.7 mm wide and 100 mm long, was cut out from the test specimen, and subjected to a vertical burning test. It showed a fire retardancy corresponding to 94V-1 in the Underwriters Laboratory (UL) standards.

EXAMPLE 33

2,2-bis(4-cyanatophenyl)propane, a cyanate ester monomer prepared from bisphenol A and cyanogen halide, was heated with stirring at 150° C. for 3 hours to produce a prepolymer of the cyanate ester.

Fifty parts of the resulting prepolymer of the cyanate ester and 50 parts of the same polyphenylene ether resin as used in Example 29 were fully mixed in a Henschel mixer. The mixture was placed in a thickness of 1.5 to 1.6 mm between two copper foils, and the assembly was compression-molded at 230° C. and 150 kg/cm² for 1 hur to prepare a test sample copper-clad on both surfaces. The properties of the test sample were measured as in Examples 15 to 22 except that the test specimen for measurement of Izod impact strength had a width of 12.5 mm and a length of 60 mm, and the test specimens for measuring dielectric constant and dielectric loss tangent were square specimens each side measuring 70 mm.

The results are shown in Table 6.

TABLE 6

| | |
|---|---|
| Proportion of the residue after extraction with chloroform | 95% |
| Glass transition temperature | 227° C. |
| Izod impact strength (unnotched) | 20.0 kg-cm/cm² |
| Peel strength of the copper foil | 1.8 kg/cm |
| Dielectric constant: (1 MHz) | 2.1 |
| Dielectric loss tangent (1 MHz) | 0.0028 |

EXAMPLES 34 TO 42 and COMPARATIVE EXAMPLES 13 AND 14

A phenylene ether copolymer (a random copolymer derived from 95 mole% of 2,6-dimethylphenol and 5 mole% of 2,3,6-trimethylphenol on monomer basis) having an intrinsic viscosity, measured at 25° C. in chloroform, of 0.34 dl/g and the same cyanate ester monomer as used in Example 23 were mixed in the proportions shown in Table 7 in a Henschel mixer. The mixture was placed in a thickness of 1.5 to 1.6 mm between two copper foils, and the assembly was compression-molded at 180° to 255° C. and 150 kg/cm² for 1 hour to prepare a test specimen copper-clad on both surfaces. The properties of the test specimen were measured in the same way as in Examples 15 to 22. The results are shown in Table 7.

For comparison, test samples copper-clad on both surfaces were prepared from the polyphenylene ether resin or the cyanate ester monomer alone in the same way as above. The properties of there test specimens are also shown in Table 7.

TABLE 7

| | Amount of the polyphenylene ether resin (parts) | Amount of the cyanate ester (parts) | Molding temperature (°C.) | Proportion of the residue after extraction with chloroform (%) | Glass transition temperature (°C.) | Izod impact strength (unnotched) (kg-cm/cm²) | Peel strength of the copper foil (kg/cm) | Dielectric constant (1 MHz) | Dielectric loss tangent (1 MHz) |
|---|---|---|---|---|---|---|---|---|---|
| Comp. Example 13 | 100 | 0 | 260 | 0 | 206 | 5.2 | 0.9 | 2.4 | 0.0008 |
| Example 34 | 99 | 1 | 260 | 3 | 210 | 5.9 | 1.2 | 2.4 | 0.0009 |
| 35 | 95 | 5 | 250 | 21 | 212 | 7.0 | 2.0 | 2.2 | 0.0010 |
| 36 | 90 | 10 | 245 | 65 | 217 | 9.0 | 2.1 | 2.0 | 0.0010 |
| 37 | 80 | 20 | 240 | 87 | 225 | 12.8 | 2.1 | 2.3 | 0.0016 |
| 38 | 60 | 40 | 240 | 95 | 231 | 22.5 | 2.2 | 2.4 | 0.0022 |
| 39 | 40 | 60 | 230 | 97 | 228 | 27.8 | 2.1 | 2.4 | 0.0029 |
| 40 | 25 | 75 | 200 | 99 | 229 | 32.8 | 2.0 | 2.4 | 0.0027 |
| 41 | 10 | 90 | 200 | 100 | 222 | 28.0 | 2.0 | 2.5 | 0.0033 |
| 42 | 5 | 95 | 190 | 100 | 218 | 23.0 | 2.0 | 2.6 | 0.0040 |
| Comp. Example 14 | 0 | 100 | 180 | 100 | 210 | 15.5 | 1.9 | 2.7 | 0.0048 |

EXAMPLES 43 and 44

Ninety parts of poly(2,6-dimethyl-1,4-phenylene)ether having an intrinsic viscosity, measured at 25° C. in chloroform, of 0.30 dl/g and 10 parts of poly(phenylmethylene)polymaleimide (containing five N-phenylmaleimide residues on an average in the molecule) produced by reacting maleic acid with a poly(phenylmethylene)-polyamine obtained by the reaction of aniline with formaldehyde, with or without 2,2-bis(4-cyanatophenyl)propane, a cyanate ester monomer prepared from bisphenol A and cyanogen halide, were fully mixed in a Henschel mixer. The mixture was placed in a thickness of 1.5 to 1.6 mm between two copper foils, and the assembly was compression-molded at 260° C. and 150 kg/cm² for 1 hour to prepare a test specimen copper-clad on both surfaces. The properties of the test specimen were measured in the same way as in Examples 15 to 22. The results are shown in Table 8.

TABLE 8

| | Example 43 | Example 44 |
|---|---|---|
| Amount of the polyphenylene ether resin (parts) | 90 | 90 |
| Amount of poly(phenylmethylene)polymaleimide (parts) | 10 | 10 |
| Amount of the cyanate ester (parts) | 0 | 4 |
| Peel strength of the copper foil (kg/cm) | 0.9 | 1.5 |

TABLE 8-continued

| | Example 43 | Example 44 |
|---|---|---|
| Dielectric constant (1 MHz) | 2.4 | 2.4 |
| Dielectric loss tangent (1 MHz) | 0.0026 | 0.0020 |

EXAMPLES 45 and 46

Forty parts of the same phenylene ether copolymer having an intrinsic viscosity of 0.34 dl/gr as used in Example 1 and 60 parts of the same bismaleimide as used in Example 6, with or without a prepolymer derived from 2,2-bis(4-cyanotophenyl)propane (KL3-4000, a 70% methyl ethyl ketone solution, a trademark for a product of Bayer AG), were fully mixed in a Henschel mixer. The mixture was dried in vacuum to remove methyl ethyl ketone. The resulting mixture was placed in a thickness of 1.5 to 1.6 mm between two copper foils, and the assembly was compression-molded at 260° C. and 150 kg/cm² for 1 hour to prepare a test specimen copper-clad on both surfaces. The properties of the test specimen were measured in the same way as in Examples 15 to 22. The results are shown in Table 9.

TABLE 9

| | Example 45 | Example 46 |
|---|---|---|
| Amount of the polyphenylene ether resin (parts) | 40 | 40 |
| Amount of the bismaleimide (parts) | 60 | 60 |
| Amount of the cyanate ester prepolymer (parts) | 0 | 5.7 (4 as solids) |
| Peel strength of the copper foil (kg/cm) | 0.8 | 1.2 |
| Dielectric constant (1 MHz) | 2.4 | 2.6 |
| Dielectric loss tangent (1 MHz) | 0.0058 | 0.0031 |

EXAMPLE 47

Ten parts of poly(2,6-dimethyl-1,4-phenylene)ether having an intrinsic viscosity, measured at 25° C. in chloroform, of 0.45 dl/g, 90 parts of bismaleimide prepared from maleic anhydride and 4,4'-bisaminophenylmethane, and 20 parts of 2,2-bis(4-cyanatophenyl)propane, a cyanate ester monomer prepared from bisphenol A and cyanogen halide, were fully mixed in a Henschel mixer. The mixture was placed in a thickness of 1.5 to 1.6 mm between two copper foils, and the assembly was compression-molded at 250° C. and 150 kg/cm² for 1 hour to prepare a test specimen copper-clad on both surfaces. The properties of the test specimen were measured in the same way as in Examples 15 to 22. The results are shown in Table 10.

TABLE 10

| Peel strength of the copper foil | 1.0 kg/cm |
|---|---|
| Dielectric constant (1 MHz) | 2.6 |
| Dielectric loss tangent (1 MHz) | 0.0040 |

EXAMPLE 48

Fifty parts of the same phenylene ether copolymer (intrinsic viscosity 0.18 dl/g) as used in Example 1, 50 parts (as solids) of the same N-methyl pyrrolidone solution of bismaleimide-diamine prepolymer as used in Example 10, and 700 parts of a prepolymer of a cyanate ester produced by stirring 2,2-bis(4-cyanatophenyl)propane (a cyanate ester monomer prepared from bisphenol A and cyanogen halide) at 150° C. for 3 hours were fully mixed in a Henschel mixer. The mixture was dried in vacuum in order to remove the N-methyl pyrrolidone, and a copper-clad test specimen was produced by compression-molded at 250° C. and 150 kg/cm² for 1 hour. The properties of the test specimen were measured in the same way as in Examples 15 and 22. The results are shown in Table 11.

TABLE 11

| Peel strength of the copper foil | 1.8 kg/cm |
|---|---|
| Dielectric constant (1 MHz) | 2.8 |
| Dielectric loss tangent (1 MHz) | 0.0030 |

EXAMPLE 49

Eighty parts of the same cyanate ester monomer as used in Example 43 and 20 parts of the same bismaleimide as used in Example 45 were placed in a beaker, and reacted at 140° C. with stirring for 3 hours to form a pre-copolymer of the maleimide and the cyanate ester. Fifty parts of the resulting pre-copolymer and 50 parts of poly(2,6-dimethyl-1,4-phenylene)ether having an intrinsic viscosity, measured at 25° C. in chloroform, of 0.34 dl/g were fully mixed in a Henschel mixer. The resulting mixture was placed in a thickness of 1.5 to 1.6 mm between two copper foils, and the assembly was compression-molded at 260° C. and 150 kg/cm² for 1 hour. The properties of the test specimen were measured in the same way as in Examples 15 to 22. The results are shown in Table 12.

TABLE 12

| Peel strength of the copper foil | 1.8 kg/cm |
|---|---|
| Dielectric constant (at 1 MHz) | 2.7 |
| Dielectric loss tangent (1 MHz) | 0.0038 |

EXAMPLE 50

Thirty parts of poly(phenylmethylene)polymaleimide (containing three N-phenylmaleimide groups on an average in the molecule) produced by reacting maleic acid with a poly(phenylmethylene)polyamine obtained by the reaction of aniline with formaldehyde, and 70 parts of the same 2,2-bis(4-cyanatophenyl)propane as used in Example 43 were put into a beaker, and reacted at 110° C. with stirring for 2 hours to prepare a pre-copolymer of the maleimide and the cyanate ester. Seventy parts of the pre-copolymer and 30 parts of the same polyphenylene ether resin as used in Example 45 were fully mixed in a Henschel mixer. The resulting mixture was placed in a thickness of 1.5 to 1.6 mm between two copper foils, and the assembly was compression-molded at 250° C. and 150 kg/cm² for 1 hour to prepare a test specimen copper-clad on both surfaces. The properties of the test specimen were measured in the same way as in Examples 15 to 22. The results are shown in Table 13.

TABLE 13

| Peel strength of the copper foil | 1.6 kg/cm |
|---|---|
| Dielectric constant (1 MHz) | 2.4 |
| Dielectric loss tangent (1 MHz) | 0.0040 |

EXAMPLES 51 to 54

Ninety parts of the same polyphenylene ether resin as used in Example 45, 10 parts of the same poly(phenylmethylene)polymaleimide and the same cyanate ester prepolymer as used in Example 48 in each of the amounts indicated in Table 14 were fully mixed in a Henschel mixer. The mixture was placed in a thickness of 1.5 to 1.6 mm between two copper foils, and the assembly was compression-molded at 200° to 245° C. and 130 to 150 kg/cm² for 90 minutes to prepare a test specimen copper-clad on both surfaces.

The properties of the test specimen were measured in the same way as in Examples 15 to 22, and the results are shown in Table 14.

TABLE 14

| Example | 51 | 52 | 53 | 54 |
|---|---|---|---|---|
| Amount of the polyphenylene ether resin (parts) | 90 | 90 | 90 | 90 |
| Amount of the poly(phenylmethylene)polymaleimide (parts) | 10 | 10 | 10 | 10 |
| Amount of the cyanate ester prepolymer (parts) | 0 | 3 | 100 | 400 |
| Proportion of the residue after extraction with chloroform (%) | 80 | 83 | 87 | 92 |
| Peel strength of the copper foil (kg/cm) | 0.9 | 1.4 | 2.0 | 2.2 |
| Dielectric constant (1 MHz) | 2.3 | 2.5 | 2.5 | 2.5 |
| Dielectric loss tangent (1 MHz) | 0.0029 | 0.0019 | 0.0035 | 0.0050 |

EXAMPLES 55 to 58

Forty parts of the same polyphenylene ether resin as used in Example 45 and 60 parts of the same bismaleimide as used in Example 45 were mixed, and the same 2,2-bis(4-cyanatophenyl)propane as used in Example 43 was added in each of the amounts shown in Table 15. They were fully mixed in a Henschel mixer. The resulting mixture was placed in a thickness of 1.5 to 1.6 mm between two copper foils, and the assembly was compression-molded at 180° to 235° C. and 130 to 150 kg/cm² for 90 minutes to prepare a test specimen copper-clad on both surfaces.

The properties of the test specimen were measured in the same way as in Examples 15 to 22, and the results are shown in Table 15.

TABLE 15

| Example | 55 | 56 | 57 | 58 |
|---|---|---|---|---|
| Amount of the polyphenylene ether resin (parts) | 40 | 40 | 40 | 40 |
| Amount of bismaleimide (parts) | 60 | 60 | 60 | 60 |
| Amount of the cyanate ester (parts) | 0 | 3 | 100 | 400 |
| Proportion of the residue after extraction with chloroform (%) | 100 | 100 | 99 | 100 |
| Peel strength of the copper foil (kg/cm) | 0.8 | 1.1 | 1.8 | 2.1 |
| Dielectric constant (1 MHz) | 2.3 | 2.6 | 2.7 | 2.8 |
| Dielectric loss tangent (1 MHz) | 0.0049 | 0.0029 | 0.0031 | 0.0039 |

EXAMPLES 59 and 60

Ten parts of the same polyphenylene ether resin as used in Example 45 and 90 parts of the same bismaleimide as used in Example 45 were mixed, and the same cyanate ester prepolymer as used in Example 48 was added in each of the amounts shown in Table 16. They were mixed fully in a Henschel mixer. The resulting mixture was placed in a predetermined thickness between two copper foils, and the assembly was compression-molded at 180° C. and 130 to 150 kg/cm² for 90 minutes to prepare a test specimen copper-clad on both surfaces. The properties of the test specimen were measured in the same way as in Examples 15 to 22, and the results are shown in Table 16.

TABLE 16

| | Example 59 | Example 60 |
|---|---|---|
| Amount of the polyphenylene ether resin (parts) | 10 | 10 |
| Amount of the bismaleimide (parts) | 90 | 90 |
| Amount of the cyanate ester prepolymer (parts) | 100 | 400 |
| Proportion of the residue after extraction with chloroform (%) | 100 | 100 |
| Peel strength of the copper foil (kg/cm) | 1.8 | 2.1 |
| Dielectric constant (1 MHz) | 2.7 | 2.8 |
| Dielectric loss tangent (1 MHz) | 0.0031 | 0.0039 |

What we claim is:

1. A curable polyphenylene ether resin composition comprising:
   (a) a polyphenylene ether resin, and
   (b) at least one polyfunctional compound selected from the group consisting of polyfunctional maleimides of the general formula:

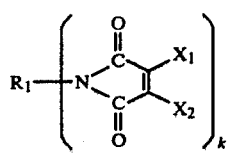

wherein k is an integer of at least 2; $X_1$ and $X_2$ are identical or different and each represents a hydrogen atom, a halogen atom or a lower alkyl group; and $R_1$ represents an aromatic or aliphatic organic group having a valence of k, which is selected from the group consisting of a linear or cyclic aliphatic hydrocarbon group having 4 to 16 carbon atoms, a monocyclic or fused ring aromatic hydrocarbon group, a triazine ring, a moiety resulting from the removal of the amino group from a condensation product of aniline and formaldehyde and a polybenzene group represented by the following formula:

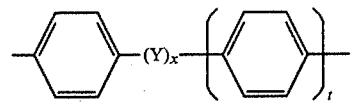

wherein x represents 0 or 1 and when x represents 1, Y represents a linear, branched or cyclic aliphatic hydrocarbon group having 1 to 14 carbon atoms, a phenylene group, a xylylene group, an oxygen atom, a sulfur atom, a carbonyl group, a sulfonyl group, a sulfinyl group, an alkyleneoxyalkylene group, a phosphonyl group, a phosphinyl group, or an imino group; and t is an integer of 1 or 2, or the homoprepolymer thereof obtained by reacting at least one of said polyfunctional maleimides under heat and stopping the reaction before the reaction mixture is gelled, polyfunctional cyanate esters of the general formula:

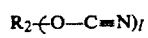

wherein l is an integer of at least 2; and $R_2$ represents an aromatic organic group having a valence of l, which is selected from the group consisting of a monocyclic or fused ring aromatic hydrocarbon roup, a triazine ring, a residue resulting from the removal of the amino group from a condensation product of aniline and formaldehyde and a polybenzene group represented by the following formula:

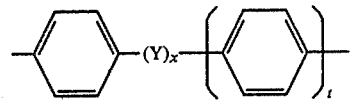

wherein x represents 0 or 1 and when x represents 1, Y represents a linear, branched or cyclic aliphatic hydrocarbon group having 1 to 14 carbon atoms, a phenylene group, a xylylene group, an oxygen atom, a sulfur atom, a carbonyl group, a sulfonyl group, a sulfinyl group, an alkyleneoxyalkylene group, a phosphonyl group, a phosphinyl group, or an imino group; and t is an integer of 1 or 2, wherein the groups $\text{---O---C}\equiv\text{N})_l$ are directly bonded to the aromatic ring of the organic group, or the homoprepolymers thereof obtained by polymerizing at least one of said polyfunctional cyanate esters and containing in the molecule a sym-triazine ring formed by the trimerization of the cyano groups, and precopolymers thereof obtained by reacting said polyfunctional maleimide with said polyfunctional cyanate ester under heat and stopping the reaction before the reaction mixture is gelled.

2. The composition of claim 1 wherein the polyphenylene ether resin is a polymer having in the polymer chain skeleton a recurring unit of the formula

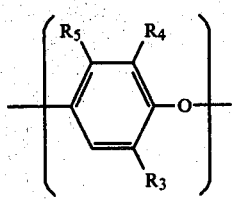

wherein $R_3$ and $R_4$ are identical or different and represent an alkyl group having 1 to 3 carbon atoms, and $R_5$ represents a hydrogen atom or an alkyl group having 1 to 3 carbon atoms.

3. The composition of claim 2 wherein the alkyl group represented by $R_3$, $R_4$ and $R_5$ is a methyl group.

4. The composition of claim 2 wherein the polyphenylene ether resin is poly(2,6-dimethyl-1,4-phenylene) ether, or a copolyphenylene ether derived from 2,6-dimethylphenol and 2,3,6-trimethylphenol.

5. The composition of claim 2 wherein the polyphenylene ether resin has a number average molecular weight of about 1000 to about 30000, calculated from the value of the intrinsic viscosity measured in chloroform at 25° C.

6. The composition of claim 1 wherein in the formula representing the polyfunctional maleimides, k is an integer of 2 to 10, $X_1$ and $X_2$ are identical or different and each represents a hydrogen atom, a chlorine atom, a bromine atom or an alkyl group having 1 to 4 carbon atoms.

7. The composition of claim 1 or 6 wherein $R_1$ represents a linear or cyclic divalent, trivalent or tetravalent aliphatic hydrocarbon group having 4 to 16 carbon atoms.

8. The composition of claim 1 wherein the monocyclic or fused ring aromatic hydrocarbon group of $R_1$ is a benzene ring, a naphthalene ring, an anthracene ring or a pyrene ring.

9. The composition of claim 1 wherein x is 0 or 1 and when x is 1, Y is a methylene group.

10. The composition of claim 1 wherein the polyfunctional maleimides are the dehydrocyclization condensates of (a) m- or p-phenylenediamine, m- or p-xylylene diamine, 1,4- or 1,3-cyclohexanediamine, hexahydroxylylenediamine, 4,4'-diaminobiphenyl, bis(4-aminophenyl)methane, bis(4-aminophenyl)ether, bis(4-aminophenyl)sulfone, bis(4-amino-3-methylphenyl)methane, bis(4-amino-3,5-dimethylphenyl)methane, bis(4-amino-3-chlorophenyl)methane, bis(4-aminophenyl)cyclohexane, 2,2-bis(4-aminophenyl)propane, 2,2-bis(4-amino-3-methylphenyl)propane, 2,2-bis(3,5-dibromo-4-aminophenyl)propane, bis(4-aminophenyl)phenylmethane, 3,4-diaminophenyl-4'-aminophenylmethane, 1,1-bis(4-aminophenyl)-1-phenylethane, melamine having an s-triazine ring, or a polynuclear polyamine obtained by reaction of aniline with formaldehyde to bond benzene rings by a methylene linkage, with (b) the corresponding maleic anhydrides.

11. The composition of claim 1 wherein in the formula representing the polyfunctional cyanate esters, l is an integer of 2 to 10.

12. The composition of claim 1 wherein the monocyclic or fused ring aromatic hydrocarbon group of $R_2$ is a benzene ring, a naphthalene ring, an anthracene ring or a pyrene ring.

13. The composition of claim 1 wherein $R_2$ is a polybenzene group of the formula:

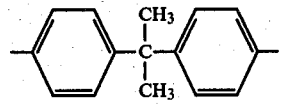

14. The composition of claim 1 wherein the polyfunctional cyanate esters are 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-cyanatophenyl)methane, 2,2-bis(4-cyanatophenyl)propane, 2,2-bis(3,5-dichloro-4-cyanatophenyl)propane, 2,2-bis(3,5-dibromo-4-cyanatophenyl)propane, bis(4-cyantophenyl)ether, bis(4-cyanatophenyl)thioether, bis(4-cyanatophenyl)sulfone, tris(4-cyanatophenyl)phosphite, tris(4-cyanatophenyl)phosphate, or a polycyanate compound obtained by reacting a precondensate having a low molecular weight and prepared by a condensation reaction of phenol and formaldehyde, with a cyanogen halide.

15. The composition of claim 1 wherein the amount of the polyphenylene ether resin is about 2 to about 99% by weight based on the total weight of the polyphenylene ether resin and the polyfunctional compound.

16. The composition of claim 15 wherein the amount of the polyphenylene ether resin is about 4 to about 99% by weight based on the total weight of the polyphenylene ether resin and the polyfunctional compound.

17. The composition of claim 1 wherein the polyfunctional compound is selected from the group consisting of the polyfunctional maleimide and its homoprepolymer in an amount of about 1 to about 70% by weight based on the total weight of the polyphenylene ether resin and the polyfunctional compound.

18. The composition of claim 1 wherein the polyfunctional compound is selected from the group consisting of the polyfunctional cyanate ester and its homoprepolymer in an amount of about 1 to about 95% by weight based on the total weight of the polyphenylene ether resin and the polyfunctional compound.

19. The composition of claim 1 wherein both a polyfunctional maleimide unit and a polyfunctional cyanate ester unit are present together, and the amount of such polyfunctional compound is about 2 to about 96% by weight based on the total weight of the polyphenylene ether resin and the polyfunctional compound.

20. The composition of claim 19 wherein the amount of the polyfunctional maleimide unit is about 1 to about 85% by weight based on the total weight of the polyphenylene ether resin and the polyfunctional compound.

21. The composition of claim 19 wherein the amount of the polyfunctional cyanate ester unit is about 3 to about 97% by weight based on the total weight of the polyphenylene ether resin and the polyfunctional compound.

* * * * *